United States Patent [19]

Treiber

[11] 4,381,561
[45] Apr. 26, 1983

[54] ALL DIGITAL LSI LINE CIRCUIT FOR ANALOG LINES

[75] Inventor: Robert Treiber, Fairfield, Conn.

[73] Assignee: International Telephone and Telegraph Corporation, New York, N.Y.

[21] Appl. No.: 199,806

[22] Filed: Oct. 23, 1980

[51] Int. Cl.³ .............................................. H04B 1/58
[52] U.S. Cl. ........................................ 370/24; 375/14; 179/170 NC
[58] Field of Search ............................ 370/24, 27, 28; 179/170.8, 170 NC, 170 D; 375/14, 16; 333/18

[56] References Cited

U.S. PATENT DOCUMENTS

| | | | |
|---|---|---|---|
| 4,174,470 | 11/1979 | Seidel | 179/170 NC |
| 4,196,405 | 4/1980 | Le Dily et al. | 375/14 |
| 4,273,963 | 6/1981 | Seidel | 375/14 |
| 4,320,498 | 3/1982 | Justice | 179/170 NC |

*Primary Examiner*—Gerald L. Brigance
*Attorney, Agent, or Firm*—John T. O'Halloran; Jeffrey P. Morris

[57] ABSTRACT

A digital telecommunication line circuit implementable on one or more large scale integrated circuit (LSI) chips is described. A simplified integrated hardware structure is provided so as to achieve the combination on an LSI chip of an electronic two-to-four wire hybrid, line impedance matching by automatic digital impedance synthesizing of an output impedance and all digital filtering functions for an all LSI telephone line circuit including automatic equalizing.

19 Claims, 15 Drawing Figures

$$\frac{I\,OUT}{V\,IN} = -g$$

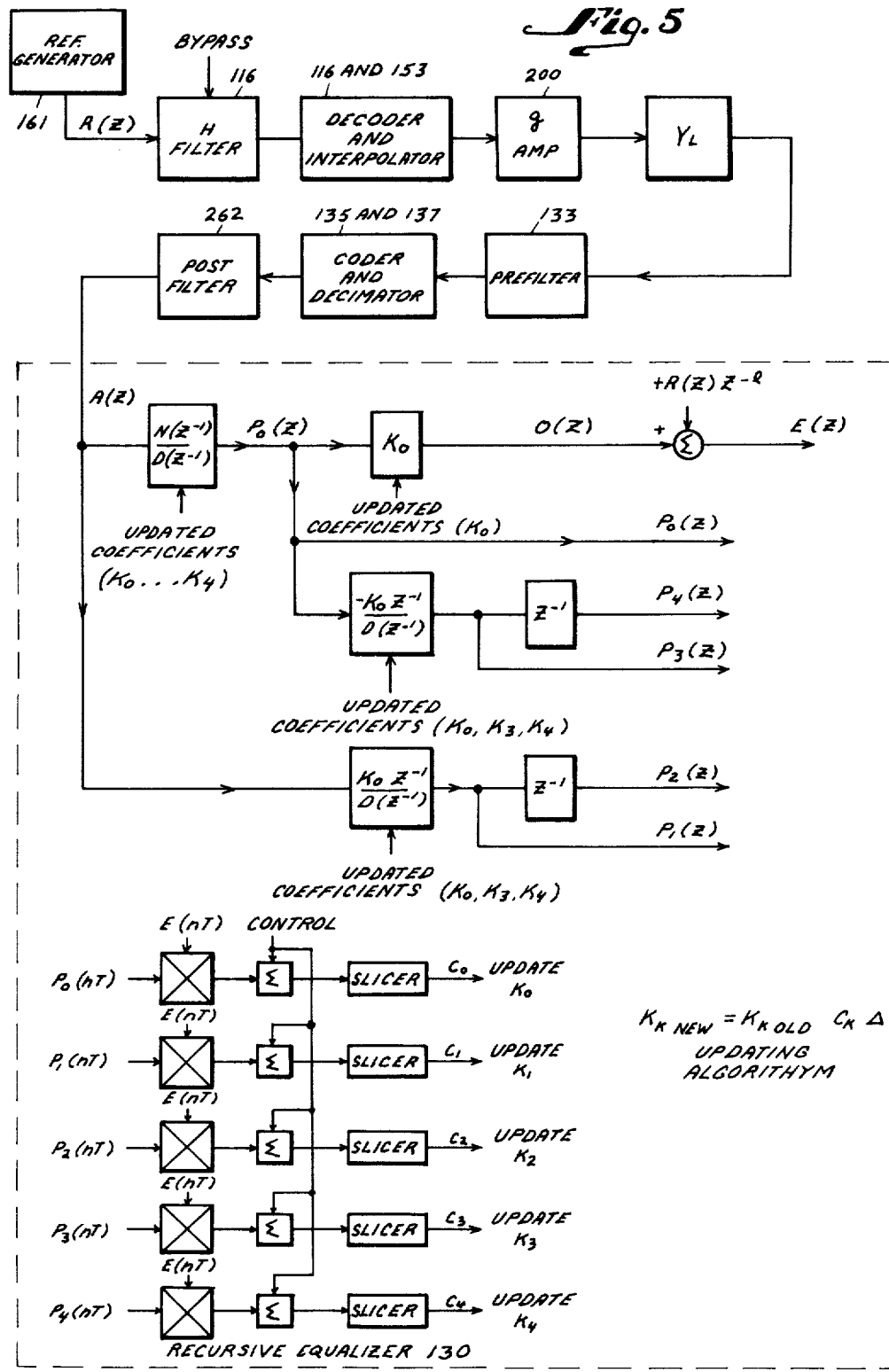

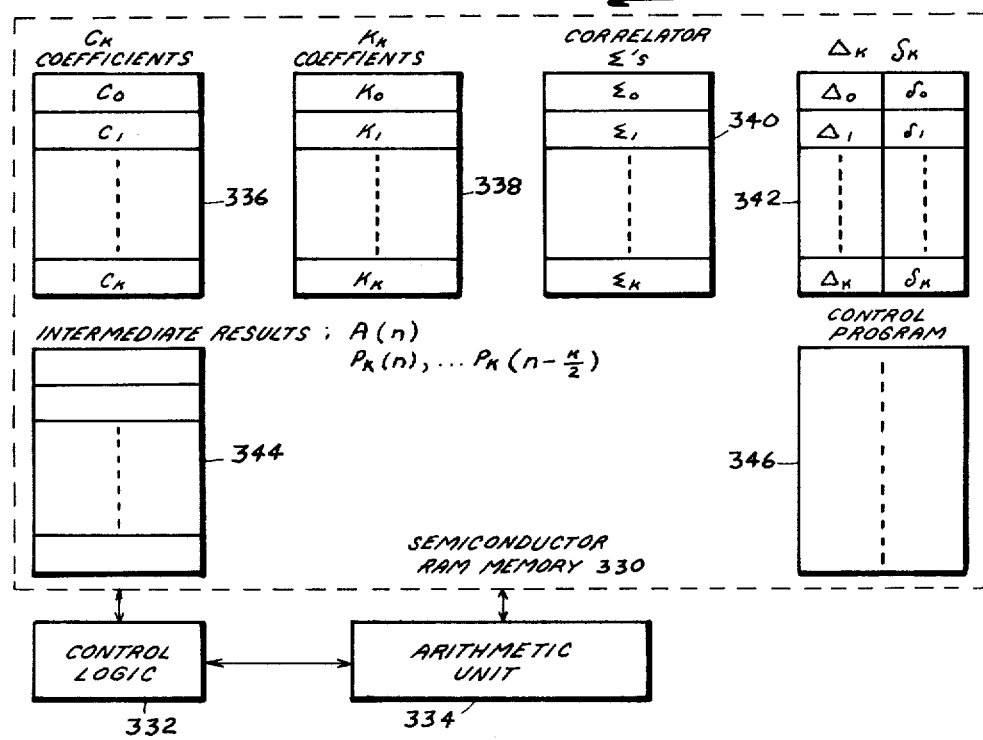
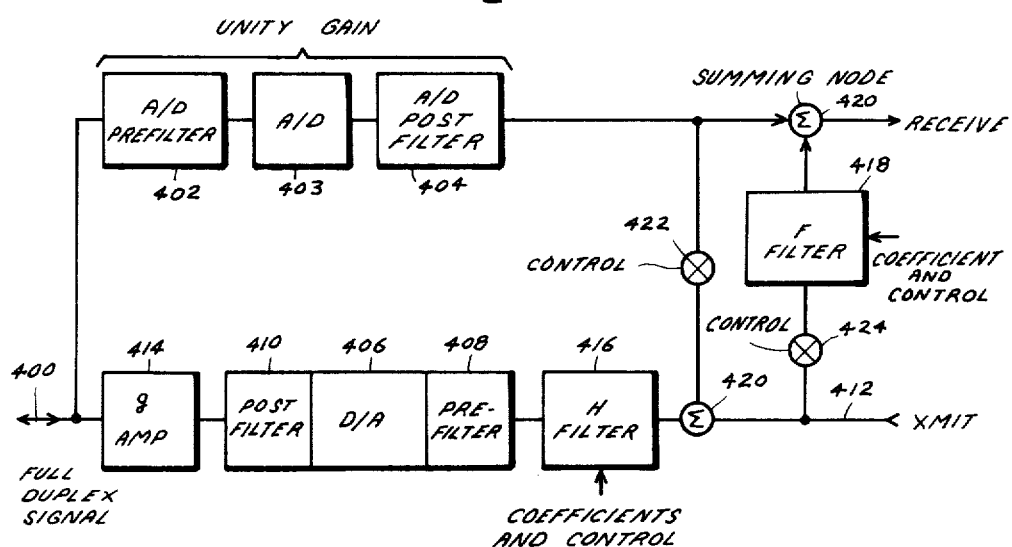

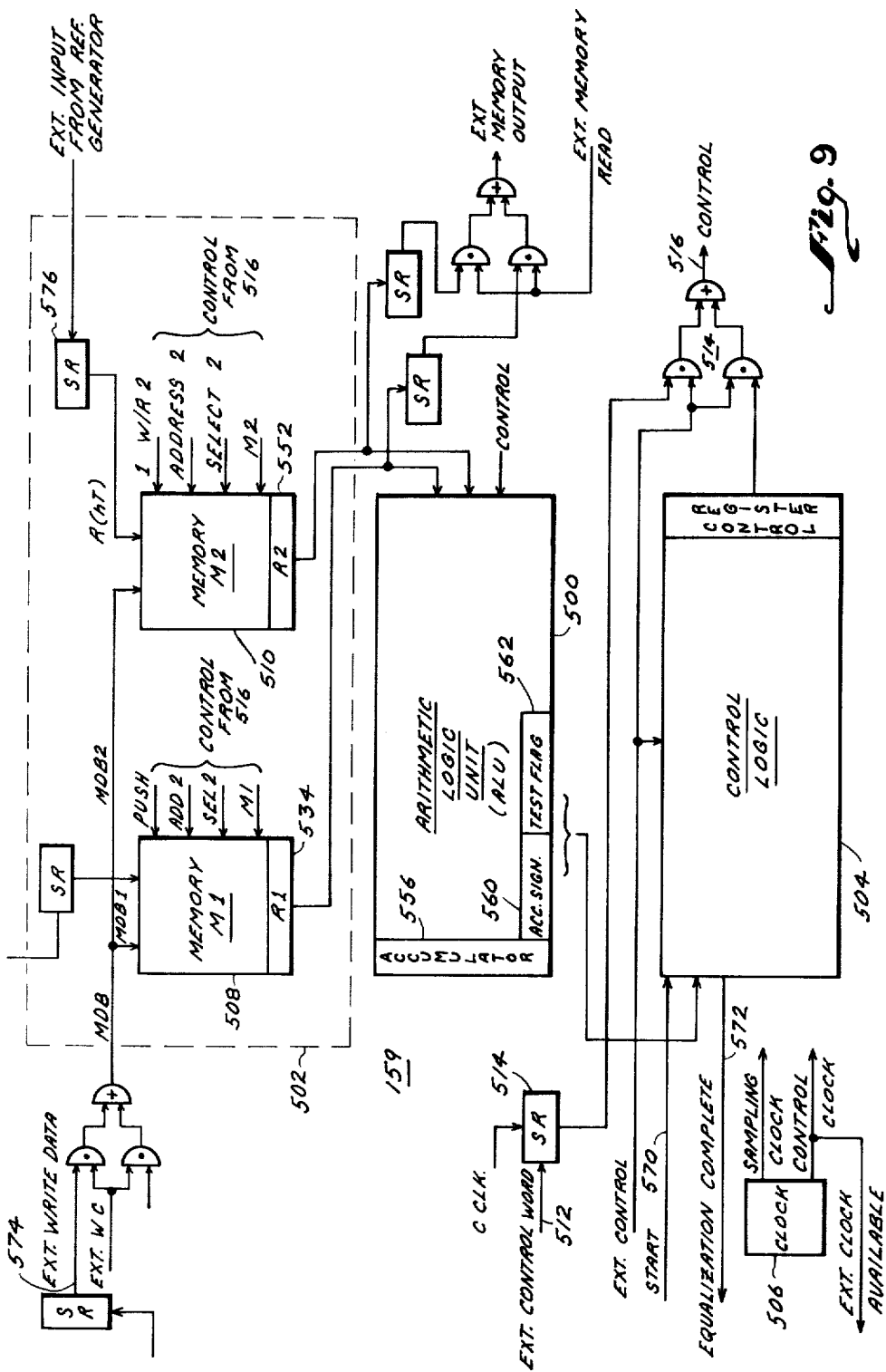

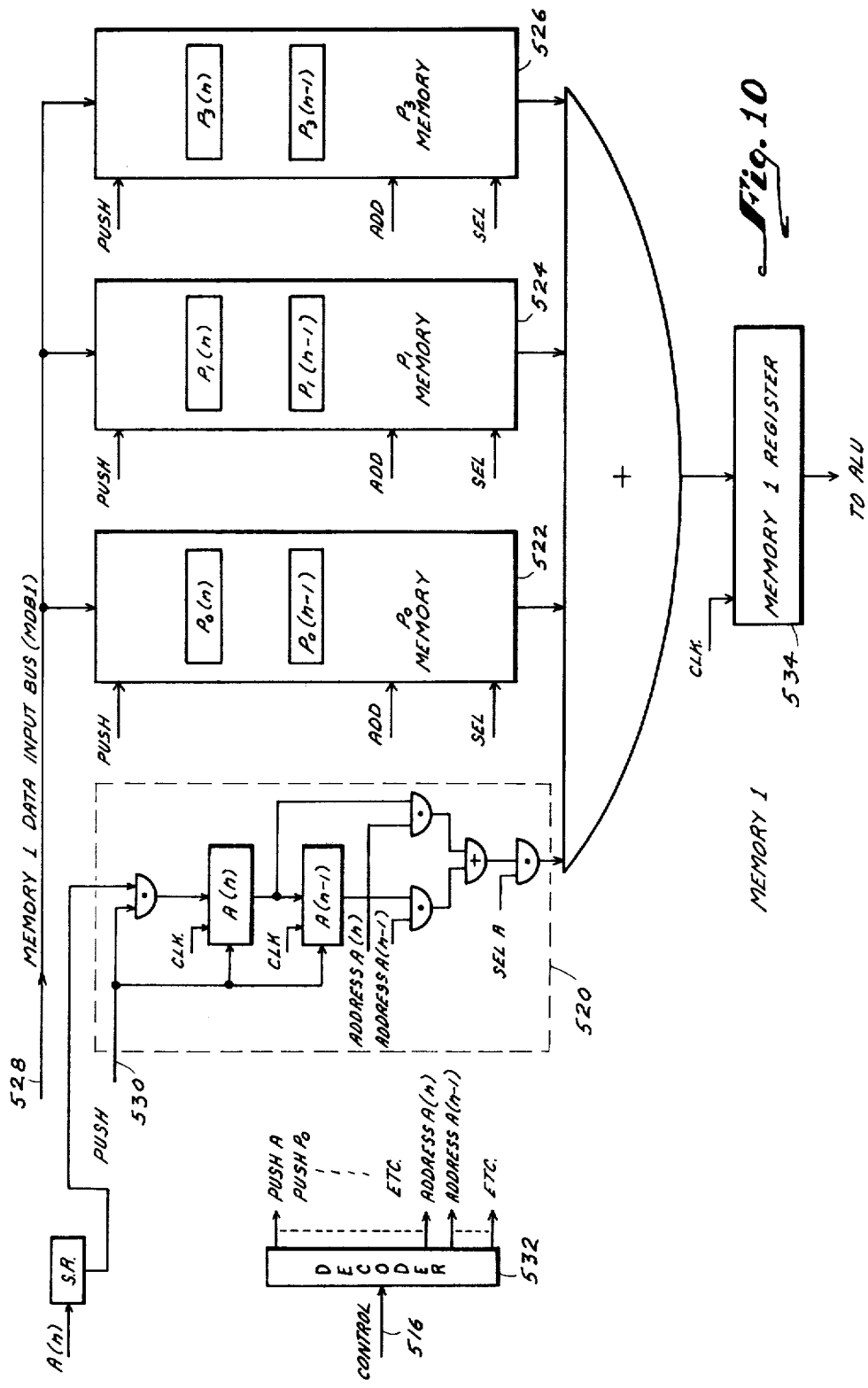

ALL DIGITAL LSI LINE CIRCUIT FOR ANALOG LINES

CROSS REFERENCE TO RELATED APPLICATIONS

U.S. patent application Ser. No. 199,904, Automatic, Digitally Synthesized Matching Line Terminating Impedance, filed on even date herewith.

U.S. patent application Ser. No. 199,905, Digital Two-To-Four Wire Converter for Full Duplex Signals, filed on even date herewith.

U.S. patent application Ser. No. 199,906, Automatic Equalizer for Synthesizing Recursive Filters, filed on even date herewith.

BACKGROUND OF THE INVENTION

1. Field of the Invention

The present invention relates generally to the field of telephone line circuits and related communication circuitry forming the interface between analog and digital telephone subscriber lines and trunks and a digital switching network. Specifically, the present invention relates to a digital line circuit providing automatic matching of the impedance of lines/trunks terminated by an electronic hybrid and to the automatic synthesis within the hybrid of the line matching impedance without the use of discrete components and with minimized power dissipation.

2. Description of the Prior Art

In the prior art relating to two-to-four wire conversion, the problem caused by the impedance mismatch at the telephone central office between the subscriber lines/trunks line and the terminating impedance is well known. Such mismatch causes poor return loss characteristics and reflections or echoes due to poor operation of the two-to-four wire hybrid, which for proper operation, requires the line impedance and terminating impedance to be equal in both phase and magnitude over the bandwidth of the telephone channel. Passive fixed terminating impedances to date represent a compromise, except at a specific frequency, due to the fact that such compromise impedance is either a series or parallel combination of a resistor and capacitor. Such a simple impedance results in a poor match for the line impedance. Typically, the hybrid which performs two-to-four wire conversion depends upon a relatively close match between the line and the terminating impedances and for optimum performance, a good match over the range of frequencies of interest is required. Compensating for this mismatch has been attempted in the prior art with balance or "building-out" networks which are a part of the hybrid, and which, for a given line, represents a custom tailoring of the circuit.

A further problem due to impedance mismatch at the far end of the line occurs if that end is improperly terminated. An unwanted reflection or echo is returned to the near end. If the near-end terminating impedance equals the line impedance and if the transhybrid loss is zero, then optimum performance is obtained from the near end equipment. The far end echo can also be minimized by the use of known echo cancellation techniques.

Such prior art echo cancellation techniques depend upon a priori knowledge of the locally transmitted signal, and an assumed non-correlative relationship between the near end transmitted signal and the far-end received signal.

Using adaptive equalization techniques, with or without training signals, the correlative portion of the far-end reflection present in the near-end receive signal can be regenerated, using an adaptive equalizer, and subtracted from this locally received signal.

Conditions for proper operation of the adaptive equalizer must be met. The equalizer must have an adequate S/N ratio to allow for equalizer convergence, and a linear network characteristic. Sufficient energy must be present across the band to allow for correct feedback control signals for digital filter tap adjustments. There must be an absence of "double-talk" during the equalization process. Next, and most significantly, the digital local office which must interface to analog subscriber loops must now add two two-to-four wire converters in order to interface these loops. Previously, with analog central offices, no hybrids were required.

These newly introduced hybrid interfaces can introduce reflections or unwanted return signals. Previously, for analog switches these additional hybrids were not present. Thus, without improved performance in the hybrid, the digital office is potentially poorer in performance than its analog predecessor.

The problem of "singing", or more explicitly, potential instability of the network in an Nyquist sense results from the unwanted feedback arising from the two-to-four wire conversions; and the system can conceivably oscillate if proper precautions are not taken. Classically, the VNL (Via Net Loss) Plan takes this condition into account by appropriately inserting attenuations throughout the network in a regulated manner, and specifying the transhybrid loss to meet some minimum criteria at those points in the network where two-to-four wire conversions take place.

Previously, in arriving at the attenuation which could be inserted in the existing networks, consideration was given to those offices (or circuits) which utilized two-to-four wire converters; namely, trunks. For analog local offices not requiring two-to-four wire converters, zero attenuation was allowed, and the insertion loss allowable was and is only a few tenths of a decibel. Thus, the problem of designing a digital local office to provide equivalent analog performance in an analog environment is aggravated by the existing VNL Plan. Experimental results show that the addition of attenuation (4-db) in the local office to overcome this problem served only to reduce the "Grade of Service", i.e. in comparison, telephone users can detect the poorer performance due to the added attenuation.

Automatic equalizers per se are well known in the field of digital data transmission, with U.S. Pat. Nos. 3,579,109 and 3,984,789 being illustrative. A digital adaptive equalizer is described in U.S. Pat. No. 3,633,105. U.S. Pat. No. 3,798,560 describes an adaptive transversal equalizer using a time-multiplexed second-order digital filter.

SUMMARY OF THE INVENTION

A digital telecommunication line circuit implementable on one or more large scale integrated circuit (LSI) chips is described. A simplified integrated hardware structure is provided so as to achieve the combination on an LSI chip of an electronic two-to-four wire hybrid, line impedance matching by automatic digital impedance synthesizing of an output impedance and all digital filtering functions for an all LSI telephone line circuit including automatic equalizing.

It is, therefore, a primary object of the invention to eliminate the analog two-to-four wire converters in the telephone line circuit by performing the two-to-four wire conversion function digitally;

Another object of the invention is to provide automatic line impedance matching at call set-up by providing an electronically synthesized terminating impedance at the line circuit which matches the subscriber line impedance;

Another object of the invention is the implementation of a telephone line circuit in LSI technology;

Another object of the invention is to substantially minimize echoes due to hybrids and impedance mismatches at the telephone switching office;

Another object of the invention is the provision of an automatic equalizing function for telephone subscribers wherein the equalization is implemented digitally using a recursive digital filter having programmable coefficients to minimize the error between the filter input and a reference;

Yet another object of the invention is the provision of fast equalization time by holding the digital filter tap coefficients from the last call as the starting coefficients of the current call;

Other objects and advantages of the present invention will become apparent with reference to the accompanying drawings and detailed description thereof, wherein:

BRIEF DESCRIPTION OF THE DRAWINGS

FIG. 5 illustrates a recursive automatic equalizer.

FIG. 7 illustrates a block diagram of an equalizer.

FIG. 8 illustrates a block diagram of a generalized digital two-to-four wire converter.

FIG. 9 illustrates a block diagram of a preferred embodiment of an equalizer in accordance with the present invention.

FIG. 10 illustrates a first memory portion of the equalizer of FIG. 9.

DESCRIPTION OF THE PREFERRED EMBODIMENTS

Figure 1:
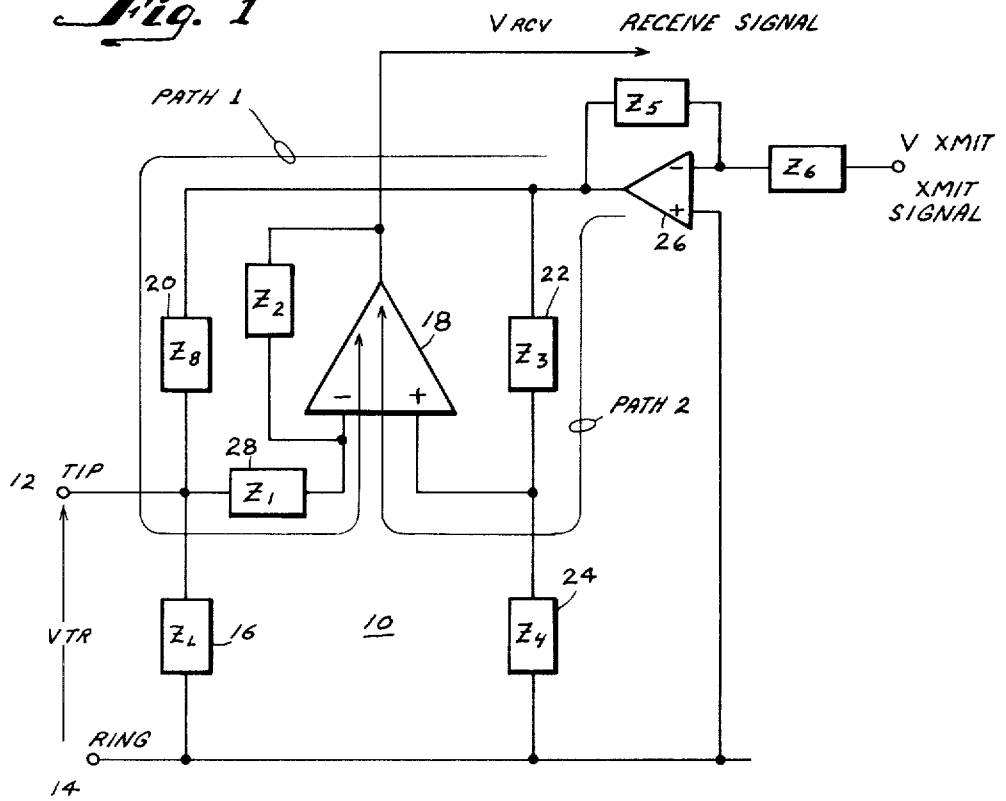
FIG. 1 illustrates a known electronic hybrid circuit.

FIG. 1 illustrates generally at 10 a state-of-the-art electronic hybrid, which performs the functions of:

(1) matching of the line impedance seen at its terminals 12 and 14 and shown in FIG. 1 as a lumped impedance $Z_L$ at 16.

(2) minimizing the unwanted return signal from transmission path 1 by providing a cancelling signal on transmission path 2 such that at the output of the receiving amplifier 18 the transmitted signal is reduced or minimized. The operation of hybrid 10 is as follows:

Impedances $Z_8$ at 20, $Z_L$ and $Z_3$, $Z_4$ at 22 and 24, respectively, form a bridge circuit with the transmitting amplifier 26 acting as the driving source and the receiving amplifier 18 acting as the null amplifier. If the bridge is appropriately balanced, then the output of the receiving amplifier 18 will be zero for any signal being transmitted. At the same time, any signal appearing across the tip and ring lines will be received at the output of amplifier 18. Thus, unwanted transmitted return signals are eliminated, thereby providing the two-to-four wire conversion function of the hybrid. The impedance seen by $Z_L$ is $Z_8$ in parallel with $Z_1$ at 28. If $Z_1$ is much greater than $Z_8$, then the transmission line sees $Z_8$ as a line terminating impedance. In practice, $Z_8$ is fixed at a set value, typically 900 ohms in series with 2.2 microfarads, and $Z_3$ and $Z_4$ are varied or selected to give the proper balance, thereby minimizing the unwanted return signal. The drawbacks of this circuit are as follows:

(1) Since $Z_8$ does not equal $Z_L$ for all transmission lines, the return loss of the circuit 10 as defined by:

$$\text{Return loss} = 20 \log_{10} \frac{Z_L + Z_8}{Z_L - Z_8} \qquad \text{(Eq. 1)}$$

is not infinite, which is the optimum value in order to minimize reflections from signals arriving from the far end.

(2) $Z_3$ and $Z_4$ must be selected on a compromise basis that the same circuit 10 can accommodate different lines, or $Z_3$ and $Z_4$ must be selected manually or automatically by an appropriate set of control signals which activate an analog switching network which place appropriate values of $Z_3$ and $Z_4$ in the circuit, according to some control process.

(3) The majority of the impedances shown in the circuit of FIG. 1 are complex impedances and thus require both resistive and capacitive elements.

(4) The circuit of FIG. 1 is basically analog in nature and does not lend itself to low cost, low power, high density, digital LSI techniques.

(5) The circuit of FIG. 1 requires high cost, stable and precision components in order to perform properly over the life of the equipment with which it is used.

(6) The input/output on the 4-wire side of the circuit of FIG. 1 are from the decoder and coder circuits in the codec employed in a digital switching system. Thus, to function properly, the line circuit for a digital office must include a separate codec and hybrid, in addition to the normal codec filters.

Figure 2:
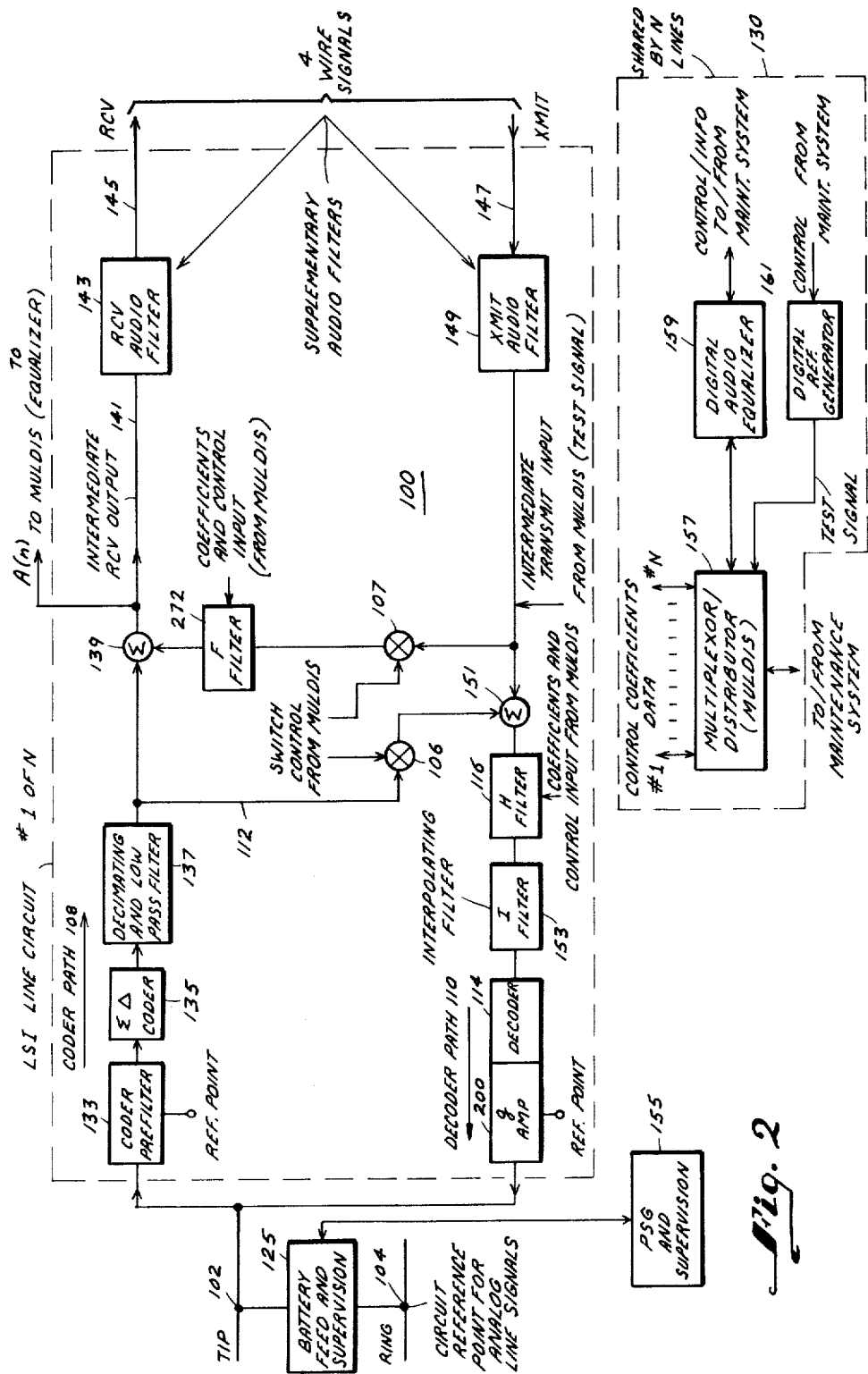
FIG. 2 illustrates a digital line circuit in accordance with the present invention.

FIG. 2 illustrates generally at 100 a block diagram of a digital line circuit in accordance with the present invention wherein the digital two-to-four wire hybrid function is performed with the elimination of the previously associated discrete analog componentry. Also, the circuit 100 provides automatic digital synthesis of line terminating impedance for any transmission line characteristic, eliminating the previously used analog componentry. These features make possible an LSI circuit implementing the complete electronic hybrid and impedance matching functions as part of an overall codec function, enabling these functions to be implemented on a single LSI chip without extensive analog external balancing or adjusting circuitry. This results in a low cost, low power, high density and a highly reliable telecommunications line-circuit. The techniques upon which this circuit is based will now be described.

Referring back to FIG. 1, if impedance $Z_8$ could be made exactly equal to impedance $Z_L$ over the range of transmission lines for which the impedance is intended, then impedances $Z_3$ and $Z_4$ could be made equal resistive elements, resulting in the elimination of return signals and providing an exact impedance match in order to maximize return loss as described previously. The circuit of FIG. 2 achieves this utilizing digital filtering and feedback techniques without the use of the hetetofore used analog components. Referring again to FIG. 2, the impedance seen looking into the tip and ring terminals 102 and 104 is designed to match the line impedance.

The line terminating impedance $Z_8$ described with reference to FIG. 1 is digitally synthesized by the digital loop of circuit 100 formed when switch 106 is operated providing feedback from the coder path 108 to the decoder path 110 via line 112.

Figure 4:
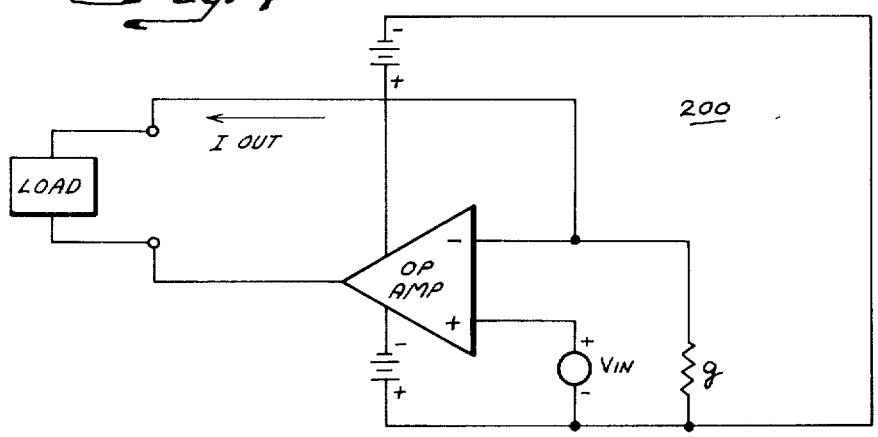
FIG. 4 illustrates a transconductance amplifier.
Figure 3A:
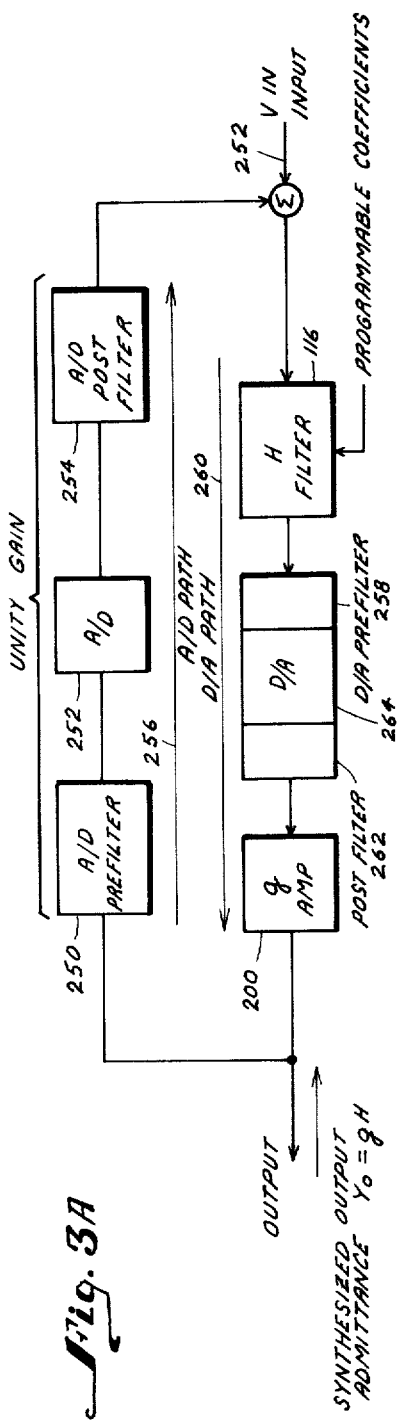
FIG. 3A illustrates digitally synthesizing an output admittance.
Figure 3B:
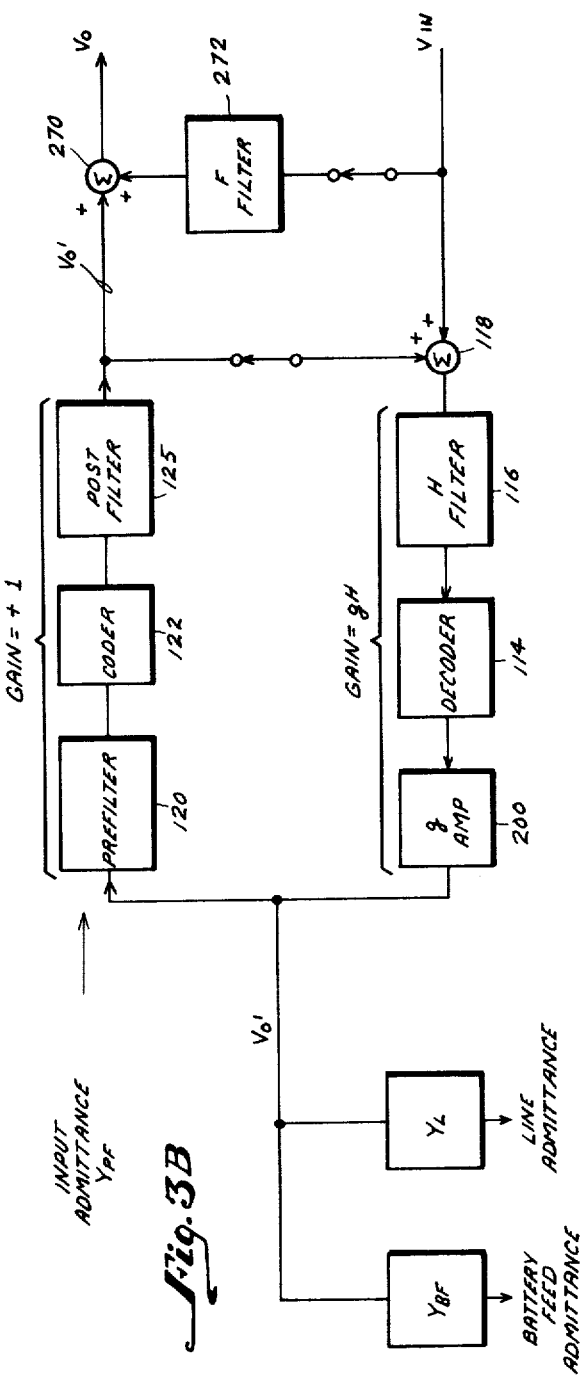
FIG. 3B illustrates a simplified block diagram of impedance matching in a digital hybrid.

FIG. 3B illustrates a simplified block diagram of such digital synthesis. The transconductance or g amplifier 200 is a device which converts an input voltage $V_x$ to an output current $-gV_x$. It has an infinite output impedance or zero output admittance. This type of circuit is well-known in the state-of-the-art. In its simplest form, it can be equated to a pentode vaccum tube or Field Effect Transistor (FET) in which the plate or drain currents are proportional to the grid or gate to drain voltages respectively. In this embodiment, the circuit shown in FIG. 4 at 200 is exemplary, wherein a high open loop gain operational amplifier (gain = $10^6$) is used with a resistance whose conductance is g mhos.

Amplifier 200 in practice is the normal output amplifier of the decoder 114 and does not represent an added component. It is shown functionally separately for explanatory purposes only. The decoder 114 is a device which converts a digital signal into an analog voltage and this function can be implemented by well-known state-of-the-art digital to analog devices. The H filter is a digital filter with programmable coefficients which can be implemented using well-known state-of-the-art techniques in digital filtering, as will be hereinafter explained. The H filter 116 is preceded by a digital summing node 118 as shown in FIG. 3B. The function of the prefilter 120 is to limit the bandwidth of the decoder 114 input signal to the region of interest, i.e., below the sampling rate of the coder 122, in order to avoid spectral folding and to optimize the signal-to-noise characteristics of the coder 122. Prefilter 120 may comprise a simple two pole passive low-pass filter since it is analog in nature.

The coder 122 is preferably a sigma delta type described by Candy, et al. The coder post filter 124 performs the function of bandwidths limiting, decimation, and providing an overall low-pass, flat response in combination with the prefilter 120, such that the composite gain is equal to unity in the frequency band of interest, and rolls off monotonically outside this band. With the system thus defined, the response and output admittance at the points indicated at FIG. 3B can be shown to be:

$$Vo'/Vin = -gH/(Y_L' + gH) \text{ where}$$
$$Y_L' = Y_L + Y_{bf} + Y_{pf} \quad \text{(Eq. 2)}$$

and the output admittance, including Batteryfeed 125, prefilter 120 and line loads, can be represented as:

$$Yout = Y_L' + gH \quad \text{(Eq. 3)}$$

In FIG. 3A, the digital synthesis of an output admittance, is shown by a simplified and generalized circuit which can be employed for numerous applications wherein it is desireable to digitally synthesize a specific output admittance in which A/D and D/A converters are employed instead of the specialized telephonyforms of A/D and D/A, and as coder/decoders. The functions of the A/D prefilter 250 is to limit the bandwidth of the input signal Vin on line 252 to prevent spectral folding due to undersampling. After analog to digital conversion at A/D converter 252, the A/D post filter 254 "mops up" to provide overall low pass unity gain characteristic for the A/D path 256. The g Amplifier 200 and digital H filter 116 are described herein elsewhere. The D/A prefilter 258 "mops up" to insure the D/A path 260 gain equals gH. The D/A post-filter 262 eliminates or minimizes the effects of the D/A quantization process occurring in D/A converter 264. Quantizing effects are defined as the noise due to the D/A error in approximating a continuous analog output signal.

For the case where the prefilter and batteryfeed impedances (admittance) are large (small) compared to the line impedance (admittance), they can be neglected. Normally, the battery-feed impedance is designed to have this characteristic in order to prevent signal loss and the coupling of unwanted signals into the codec. The prefilter can also be designed to have the characteristic by utilizing a high series resistance or the high input impedance of the gate input of a Field Effect Transistor (FET).

Under these conditions $Y_L' = Y_L$ and the output admittance is:

$$Yout = Y_L + gH \quad \text{(Eq. 4)}$$

If gH is made equal to $Y_L$ then:

$$Vo'/Vin = -\tfrac{1}{2} \quad \text{(Eq. 5)}$$

and the output impedance of the circuit matches the line impedance.

Correspondingly, the delayed transmitted signal Vin attenuated by $-\tfrac{1}{2}$ will appear at the summing node 270 of FIG. 3B. If the digital F filter 272 provides an attenuation of $\tfrac{1}{2}$ and an absolute delay corresponding to the round-trip delay from the H filter 116 input to the coder post filter 125 output, then the output filter 272 will cancel the unwanted returned transmit signal Vin at the output of the summing node 270 resulting in an output voltage Vo which does not contain any portion of the transmitted signal, Vin. Implementation of the F filter 272 is, under these conditions, simplified since it can consist of a simple shift-register type delay element. Attenuation of $\tfrac{1}{2}$ is accomplished by right shifting the binary value of the voltage Vin one place and rounding off.

For a more general application of this technique where immittances of the prefilter and batteryfeed type are not negligible but are known, gH can be changed to eliminate the loading effects of the immittances on the line, i.e.:

$$gH = Y_L - Y_x \quad \text{(Eq. 6)}$$

where $Y_x$ corresponds to their combined admittance. Under these circumstances, the round trip gain (thru codes and decoder paths 108 and 110 respectively) changes to:

$$V_o'/V_{in} = -\tfrac{1}{2} + (Y_x/2Y_L) \qquad \text{(Eq. 7)}$$

and the net admittance seen by the line at terminals 102 and 103 remains equal to $Y_L$. The effect of the second right hand term in Equation 7 represents the effect of the modification of the H filter 116 to compensate for $Y_x$. This results in F filter 272 being modified such that:

$$F = +gH/2Y_L \qquad \text{(Eq. 8)}$$

in order to cancel the unwanted transmit signal returned to the receive output at $V_o$.

In sampled data Z transform notation, the digital H filter is of the form:

$$H(Z) = K_o \frac{Z^2 + K_1 Z + K_2}{Z^2 + ZK_3 + K_4} = K_o \frac{N(Z)}{D(Z)} = \qquad \text{(Eq. 9)}$$

$$K_o \frac{[1 + K_1 Z^{-1} + K_2 Z^{-2}]}{[1 + K_3 Z^{-1} + K_4 Z^{-2}]} = K_o \frac{N(Z^{-1})}{D(Z^{-1})}$$

where Z is a delay operator, K's are programmable coefficients, and N and D represent numerator and denominator polynomials. The filter has its poles and zeroes restricted to within the unit circle of the Z plane.

Relating the above to the synthesized $Y_L$, this allows $Y_L$ to be equivalent to any combination of resistors, capacitors and inductors in which there are no more than two non-resistive elements. This restriction is not inherent to the technique. It has been chosen to simplify the form of the H filter 116 from the viewpoint of a large scale integrated circuit hardware implementation in order to obtain a simple recursive digital filter having five (5) coefficients. In addition, limiting the number of elements composing $Y_L$ as described hereinbefore, represents a good practical approximation to the function. For applications other then telephone line circuits, the definition of the H filter 116 may be extended according to the complexity of the immittances involved, based on the techniques described herein. For example, in the case where $Y_x$ has a non-resistive component, gH, corresponding to $Y_L - Y_x$, can be designed to have third order polynomials in its numerator and denominator. This would allow $Y_L$ as synthesized to meet the previous constraint of no more than two non-resistive elements.

Referring now to FIG. 5, the recursive auto equalizer 130 will be described. The need to establish the coefficients of the H filter 116 such that gH equals $Y_L$ (or $Y_L - Y_x$) is satisfied by the equalizer 130 function. The "equalizer system 130", under control of the maintenance systemroutinely checks that the digital filter coefficients are correct in addition to establishing them initially. The equalizer operates in an off-line manner (no user call in progress) and can be time shared by N lines. Once the filter coefficients are established, these coefficients need only to be checked periodically, under control of the maintenance system, since any given telephone line characteristic does not normally vary from day to day. This allows the equalizer to be time shared among a number of line circuits, thereby effectively amortizing its cost over a number of lines. FIG. 5 illustrates the conditions under which the recursive equalizer of the present invention operates. Switches 106 and 107 of FIG. 2, when open, disconnect the F filter 272 and the feedback on line 112 from the coder path 108. The H filter 116 is set up to be in the bypass mode (H filter is effectively short circuited across input-/output terminal, i.e., gH=1). (FIG. 2 can be described as follows:

The code path 108 includes coder prefilter 133, a sigma delta coder 135 and a decimating and low pass filter 137. The filter 137 output and F filter 272 output are summed at summing node 139 to derive the intermediate receive output on line 141, which is filtered at receive audio filter 143. The output of filter 143 is the 4-wire receive signal of its line circuit, on line 145. The 4-wire transmit signal on line 147 is filtered by transmit audio filter 149. The output of filter 149, the intermediate transmit input, is coupled to H filter 116 via summing node 151, whereat the intermediate transmit signal is summed with the feedback on line 112, when switch 106 is closed, under control of multiplexor/distributor 130. Prior to decoding at decoder 114, the filtered transient signal is filtered by an interpolating filter 153. Programmable signal generators circuit 155 is shown for completeness, and reference is made to U.S. Pat. No. 4,161,633 of R. Treiber for details of circuit 155. The muldis 130 includes means for distributing control coefficients for 1 ... N line circuits, shown generally at 157, and which includes a digital audio equalizer 159 and a digital reference generator 161.)

A telephone subset at the subscriber end of the line is taken off-hook by a maintenance action. At the intermediate transmit input point, a reference generator 161 supplies a reference signal having uniform (equal) energy components within the frequency band of normal operation and zero energy outside the band. The output signal O(Z) will be correct when, with reference to FIG. 5, $$E(Z) = 0 \text{ where } Z = \text{delay operator, and} \qquad \text{(Eq. 10)}$$
$$E(Z) = O(Z) = R(Z) Z^{-L} \qquad \text{(Eq. 11)}$$

The $Z^{-L}$ term compensates for the known absolute sampling delays thru the loop. Under these conditions:

$$\frac{N(Z^{-1})}{D(Z^{-1})} K_o = Y_L(Z), \qquad \text{(Eq. 12)}$$

which is the desired result and the resulting recursive filter coefficients $K_o$, $K_1$, $K_3$, $K_4$ have been correctly established and can be loaded into H filter 116 for normal operation. At equalizer 130 start-up, the H filter 116 is loaded with trial coefficients or the last previous coefficient values, which allows the equalizer to converge rapidly. The equalizer effectively solves a set of simultaneous partial differential equations which minimizes the mean square G between $R[nT-LT]$ and $O(nT)$ as a function of the coefficient $K_k$. This is represented as:

$$\frac{\partial G}{\partial K_k} = \sum_n \overbrace{[O(nT) - R(nT - lT)]}^{\text{error term}} \overbrace{\frac{\partial O(nT)}{\partial K_k}}^{\text{partial}} \qquad \text{(Eq. 13)}$$

according to established theory as for example Lucky and Rudin at BSTJ November 1967 and Weiner—Time Series Analysis—MIT Press published 1964, Appendix B.

The outputs, $P_o(nT)$, $P_1(nT)$, etc., represent the partial derivatives of $O(nT)$ with respect to the filter coefficients. These outputs, when cross multiplied with $E(nT)$ summed, and periodically "sliced" by a slicer, which truncates and rounds off to the sum term and gives the $C_k$ outputs which allow the $N(Z^{-1})$ and $D(Z^{-1})$ polynomials to be updated with new coefficients according to the equation:

$$K_k\text{new} = K_k\text{old} - C_k\Delta \qquad \text{(Eq. 14)}$$

where $\Delta$ is an incremental value or factor for step adjustment. This slicing technique, and means for implementing the solution to Equation 14, is known in the auto equalizer field for *non-recursive* structures. The circuit of FIG. 5, however, uniquely implements an automatic equalizer function for a recursive equalizer structure. The circuit of FIG. 5 provides the $P_k$ terms which take into account the interaction of the coefficients $K_k$, which heretofore has been considered one of the limiting factors in recursive equalizer structures. This may be one of the reasons that non-recursive equalizer structures have prevailed in the prior art namely the inherent simplicity of obtaining the partial functions for the auto equalizers operating on the Mean Square Error Criteria. Such non-recursive structure of the prior art requires 30-60 complex coefficients, whereas a recursive structure in accordance with the present invention requires only five (5) coefficients, and consequent reduction in circuit complexity and concomitant hardware reduction.

From the block diagram of FIG. 5 showing the recursive equalizer operation, it has been determined that the equations involved are:

$$P_o(Z) = A(Z)\, 1 \frac{N(Z^{-1})}{D(Z^{-1})} \qquad \text{(Eq. 15)}$$

$$P_1(Z) = A(Z) \frac{K_o Z^{-1}}{D(Z^{-1})} \qquad \text{(Eq. 16)}$$

$$P_2(Z) = Z^{-1} P_1(Z) \qquad \text{(Eq. 17)}$$

$$P_3(Z) = \frac{-K_o Z^{-1}}{D(Z^{-1})} P_o(Z) \qquad \text{(Eq. 18)}$$

$$P_4(Z) = Z^{-1} P_3(Z) \qquad \text{(Eq. 19)}$$

$$O(Z) = K_o P_o(Z) \qquad \text{(Eq. 20)}$$

$$E(Z) = O(Z) - R(Z) \qquad \text{(Eq. 21)}$$

$$C_k\text{new} = \text{slice} \sum_1^N P_k(nT) \cdot E(nT) \qquad \text{(Eq. 22)}$$

$$K_k\text{new} = K_k\text{old} - C_k\text{new}\, \Delta \qquad \text{(Eq. 23)}$$

Using the foregoing equations in an iterative manner, the H filter 116 coefficients are continually updated to a point where the $C_k$'s are negligible compared to some values $\delta_k$'s:

$$C_k \leq \delta_k \qquad \text{(Eq. 24)}$$

The value for $\delta_k$ are dependent upon noise and other factors and are predetermined empirically. When the criteria of Equation 24 is met, the equalizer has completed its task and can be reassigned to another line.

The values obtained for the $K_k$'s are loaded into the H filter. For the case where $Y_x=0$, the F filter transfer characteristic is simply $\frac{1}{2}$ and an absolute delay corresponding to the round trip sampling delays thru the digital filters, $Z^{-L}$ in sampled data notation.

For the case where $Y_x \neq 0$, the equalization process will yield:

$$\frac{N(Z^{-1})}{D(Z^{-1})} K_o = Y_L(Z) + Y_x(Z) \qquad \text{(Eq. 25)}$$

To obtain the required value for gH, the known quantity $Y_x$, multiplied by two must be subtracted:

$$gH(Z) = \frac{N(Z^{-1})}{D(Z^{-1})} K_o - 2Y_x(Z) = Y_L(Z) - Y_x(Z) \qquad \text{(Eq. 26)}$$

In this case, the number of partial functions $P_k$ must be increased to accommodate third order polynomials for $N(Z^{-1})$ and $D(Z^{-1})$ in order to accommodate a first order polynomial type admittance for $Y_x(Z)$. The F filter 272, under these conditions, becomes:

$$F = gH/2Y_L = (Y_L - Y_x)/2Y_L \qquad \text{(Eq. 27)}$$

This value for the F filter 272 may be computed in the maintenance system from the equalization results obtained from determining gH and the known value of $Y_x$. Alternatively, the equalizer may be used to determine the value of F directly. This operation is accomplished as follows:

The coefficients for the H filter 116 are loaded, the switch 106 in the feedback path 112 of FIG. 2 is closed by a switch control signal from MULDIS 157; the F filter 272 path switch 102 is opened, and the equalizer 130 process is run. This sequence of operation will yield:

$$\frac{N(Z^{-1})}{D(Z^{-1})} K_o = \frac{2Y_L}{Y_L - Y_x} \qquad \text{(Eq. 28)}$$

and thus:

$$F = \frac{D(Z^{-1})}{N(Z^{-1})} \frac{1}{K_o} \qquad \text{(Eq. 29)}$$

The foregoing provides coefficients for a recursive filter of the same type as the H filter 116, having third order polynomials for $N(Z^{-1})$ and $D(Z^{-1})$, for a $Y_x$ of the first order polynomial type. Actual circuit implementation of the H and F filters can by accomplished using state-of-the-art techniques.

Figure 6:
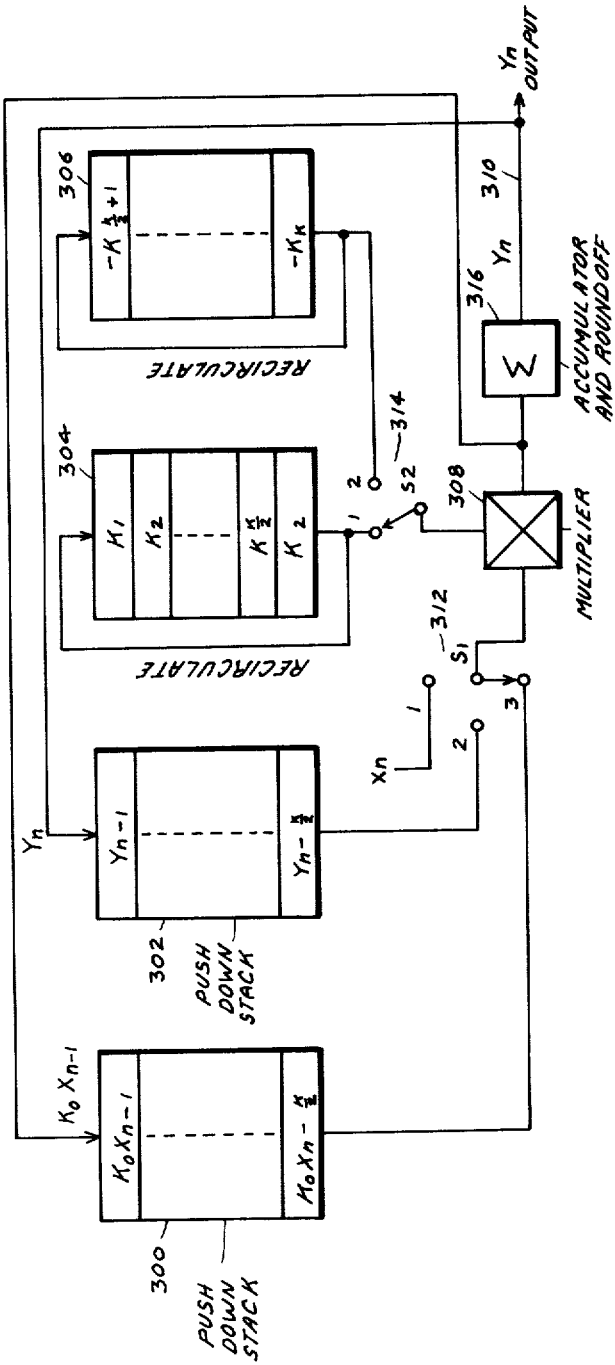
FIG. 6 illustrates a block diagram of a generalized digital filter.

FIG. 6 shows generalized H and F filters 116 and 272 for processing $N(Z^{-1})$ and $D(Z^{-1})$ polynomials having orders of k/2 according to equation 30.

$$\frac{Y(Z)}{X(Z)} = \qquad \text{(Eq. 30)}$$

$$\frac{K_o[1 + K_1 Z^{-1} + K_2 Z^{-2} \ldots K_{k/2} Z^{-k/2}]}{\left[1 + K_{\frac{k}{2}+1} Z^{-1} \ldots K_k Z^{-k/2}\right]}$$

Coefficients and data are stored in semiconductor RAM memory organized into "push down" stacks 300 and 302 and recirculating stacks 304 and 306 to facilitate fetching and storing of information. At each sample time T, data outputs of RAM memory stacks 300–306 are fed to a multiplier/summer circuit 308 which computes the required output $Y_n$ on line 310 by sequentially multiplying and accumulating the results according to Equation 31.

$$Y_n = \quad \text{(Eq. 31)}$$

$$K_o\left[X_n + K_1 X_{n-1} + K_2 X_{n-2} \cdots K_{\frac{k}{2}} X_{n-\frac{k}{2}}\right] -$$

$$\left[K_{\frac{k}{2}+1} Y_{n-1} + K_{\frac{k}{2}+2} Y_{n-2} \cdots K_k Y_{n-\frac{k}{2}}\right]$$

The first term computed is $K_o X_n$ with the switches $S_1$ at 312 and $S_2$ at 314 in position 1. $S_1$ is then placed in position 3 and the x terms are computed. After that operation, $S_1$ and $S_2$ are placed in position 2 and the y terms are computed. Thus $k+1$ multiply/add operations are involved. This can be accomplished easily within the sampling period, sharing the same memory and multiplier 308 and accumulator 316 for both the H and F filters. Thus for H and F filters having (six coefficients) $K=6$, fourteen (14) multiply/add operations are involved, allowing approximately one (1) microsecond for each such operation, and a sampling period T of 14 microseconds can be accommodated. Higher order polynomials may be accommodated by adding parallelism in the arithmetic and memory operations. Other forms of recursive filters are possible, and the filter structure of FIG. 6 is exemplary only.

In accordance with the present invention, various implementations of the equalizer structure can be realized. A preferred embodiment utilizes semiconductor RAM's, arithmetic unit and control logic to form a digital signal processing structure to implement the principles set forth in the disclosed equations. Furthermore, although the mean square error (M.S.E.) algorithm has been illustrated herein as the basis for the equalizer operation, other algorithms may be utilized to determine the coefficients of the H and F filters. For instance, the algorithm described is based upon determining values of $C_k$ over a period of a number of samples equal to NT. Each time the $C_k$'s are computed, the coefficients $K_k$'s are updated every N samples, thus $$C_k(mNT) = \text{slice} \sum_{n=(m-1)NT+1}^{mNT} P_k(nT)E(nT) \quad \text{(Eq. 32)}$$

and the new value of the coefficients are computed based on the gradient vector components $C_k$ of Equation 33:

$$K_k(m) = K_k(m-1) - C_k(m) \quad \text{(Eq. 33)}$$

By simplifying the computation of $C_k$ by approximating:

$$C_k(nT) = \text{sign } P_k(nT) \cdot \text{sign } E(nT) \quad \text{(Eq. 34)}$$

the coefficients $K_k$ may be updated at every sample time T, allowing for a more rapid convergence to the final values and reducing the amount of hardware required.

This algorithm is a simplification which approximates minimum means square error performance in a recursive filter and is advantageous, particularly where emphasis is on fast convergence and reduced hardware.

The digital filters used to develop the partial outputs $P_k$ may be implemented in like manner as for the F and H filters.

Referring now to FIG. 9, a block diagram of a specific embodiment of the equalizer 159 is illustrated. A time shared arithmetic logic unit (ALU) 500 performs sequential arithmetic and logic operations on information stored in the equalizer memory 502 under the control of control logic signals from control logic 504 and which control logic signals are synchronized with the control logic clock 506. The control clock 506 frequency is, in turn, synchronized with the data sampling clock signal, and is a multiple thereof. First and second RAM memories 508 and 510, which together comprise the equalizer memory 502, are controlled by a series of control words, each of which control words also controls the operation of the arithmetic logic unit 500.

External control words on line 512 are shifted by shift register 514 to control logic gates 514 to provide control words on line 516, under the control of control logic 504. Constants may be loaded into memory 502 under external control, the memory contents may be examined externally and the equalization process may be initiated externally. A logic signal output EC is provided when equalization is complete.

FIG. 10 illustrates the organization of the first memory 508, which comprises four push-down type stacks 520, 522, 524 and 526, of which the functional details of stack 520 are shown. Stacks 522, 524 and 526 function in like manner, as does memory stack 520. Each push-down memory stack 520–526 functions so that each new input word on memory bus 528 and line 530 replaces the last previous word in the stack and the last word in the stack is outputted from the stack. This is a first in-last out (FILO) operation. Each data location in each stack can be directly accessed or read. Register stack 520 stores words A(n), A(n−1) ... stack 522 stores Po(n), Po(n−1) ..., stack 524 stores P1(n), P1(n−1) ..., stack 526 stores P3(n), P3(n−1) .... Decoder 532 decodes the control words on line 516, from which the individual control signals to each stack. The output of each read operation is stored in memory register 534, and which output is an input to the Arithmetic Logic Unit 500.

Figure 11:
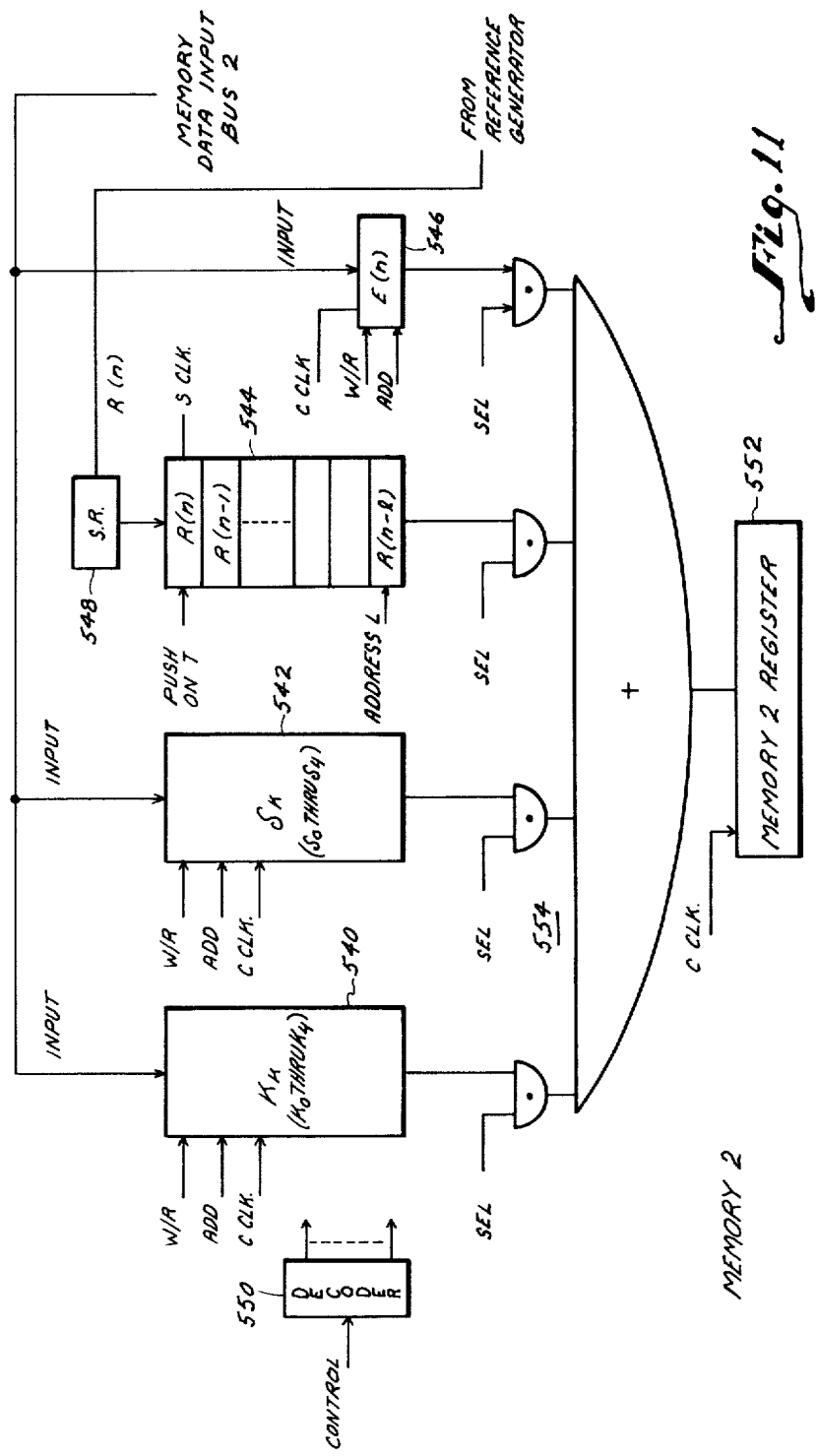
FIG. 11 illustrates a second memory portion of the equalizer of FIG. 9.

FIG. 11 illustrates the organization of the second memory 510, which includes memory sections 540, 542, 544 and 546. Memory section 540 stores constants $K_k$, including $K_o$ thru $K_4$. Memory section 542 stores data words SK, including $S_o$ thru $S_4$. Memory section 544 stores data words R(n) from reference generator 161, which are shifted in via shift register 548. Memory section 546 stores E(n). All inputs to all memory sections may be separately into memory or read out by appropriate control words which are decoded by decoder 550. Any addressed data word in any of memory sections 540–546 causes the addressed word to be coupled to memory register 552 via gating logic 554. Memory section 544 is organized as a push-down memory stack wherein any stored data word R(n), R(n−1) ... R(n−1) can be directly addressed. The Arithmetic Logic Unit 500 has, as inputs thereto, the outputs of registers 534 and 552 from memories 508 and 510, respectively. The ALU performs its arithmetic processing on these inputs, after which processing, the results are placed in its accumulator 556. These results are then coupled out for storage in memory by control logic 504.

The actual arithmetic and logic operations performed by ALU 500 will now be summarized.

The control word structure from control logic 504, which is inputted via line 514 to memories 534 and 552 consists, for example, of a 6-bit memory M1 field, a 7-bit memory M-2 field and a 5-bit ALU 500 field. Each control word is then 18-bits. The foregoing is shown below.

| Memory M1 Field | M1 \| 1 \| | Push 2 | Address 1 | Select 2 | Subtotal 6-bits |
|---|---|---|---|---|---|
| Memory M2 Field | M2 \| 1 \| | Read/Write 1 | Address 3 | Select 2 | Subtotal 7-bits |
| ALU 500 Field | Operation \| 5 \| | | | | Subtotal 5-bits |
| Control Word | Memory M1 Instruction Field 6 | | Memory M2 Instruction Field 7 | ALU Instruction Field 5 | Total 18-bits |

| Function | Operation |
|---|---|
| Multiply | $C(R1) \cdot C(R2) \rightarrow ACC$ |
| Multiply/Add | $C(R1) \cdot C(R2) + C(ACC) \rightarrow ACC$ |
| Subt/Add | $C(\pm R1) \pm C(\pm R2) + C(ACC) \rightarrow ACC$ |
| Increment | $C(M2) + |LSB \rightarrow M2$ |
| Decrement | $C(M2) - |LSB \rightarrow M2$ |
| Complement ACC, if Neg | If sign ACC is −<br>$2^N - C(ACC) \rightarrow ACC$ |
| Zero ACC | "0" Value $\rightarrow ACC$ |
| Initialize | Set up to begin equalization process |

To implement the multiply function, the contents of memory registers 534 and 552 are multiplied and stored in accumulator 556.

To implement the multiply/add function, the contents of memory registers 534 and 552 are multiplied, and the result is added to the contents of accumulator 556.

To implement the subtract/add function, the contents of either or both registers 534 and 552, with appropriate sign changes under control of a field code, are added to the contents of accumulator 556.

To implement the increment operation or the decrement operation, the contents of the particular memory location is incremented or decremented if the sign of the accumulator at 560 is respectively negative or positive, also according to the field code.

To implement the "complement accumulator if negative" function, the sign of the contents of the accumulator is changed to positive when it is negative.

To implement the "zero accumulate" function, the numeric value zero is stored in the accumulator.

To implement the initialize function, which allows for external loading of constants if an external write control signal is present, the accumulator is cleared and accumulator flags at 562 are reset.

Figure 12:
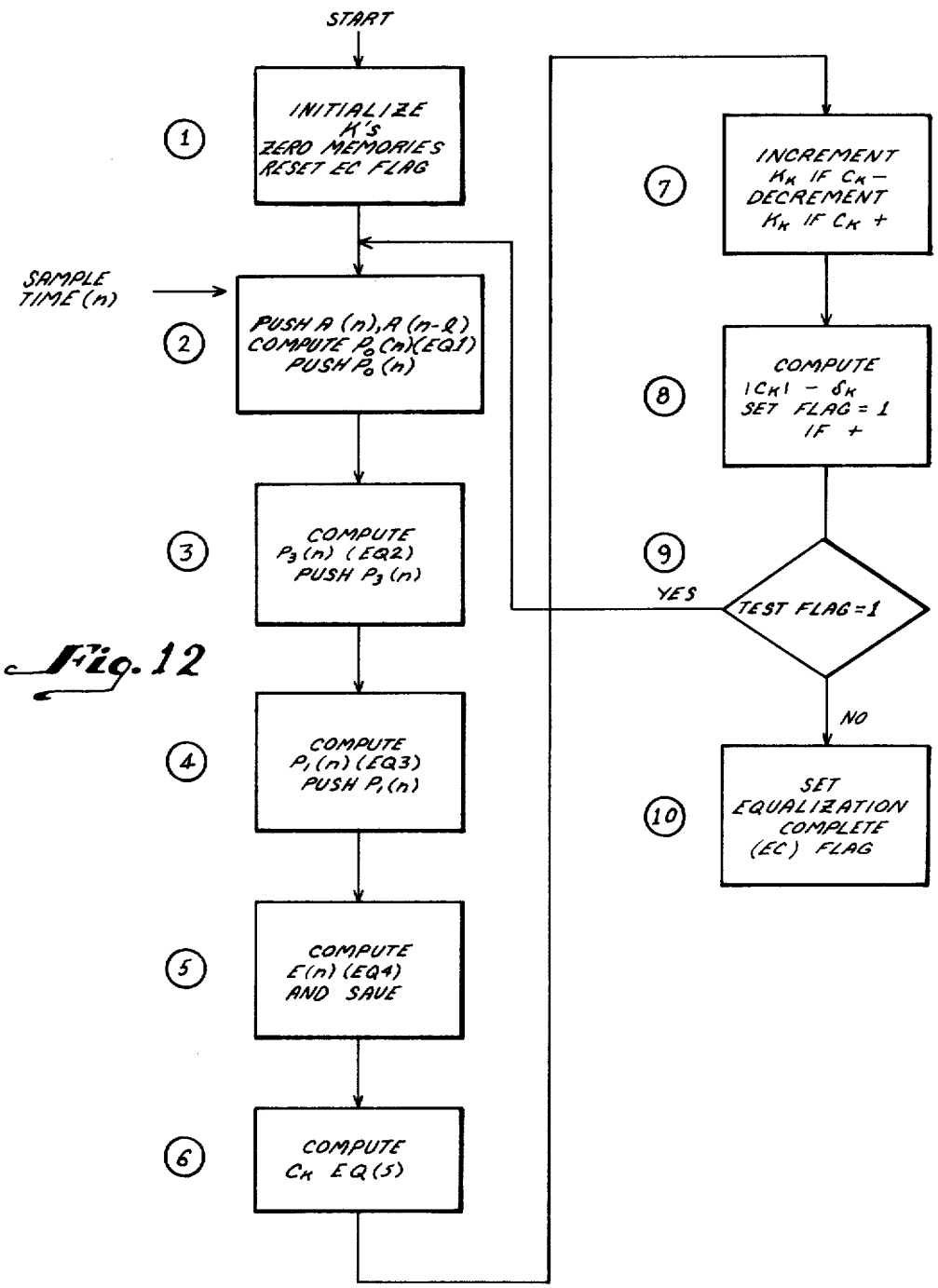
FIG. 12 illustrates a flow chart of the equalizer operation.

Referring now to FIG. 12, a flow chart of the equalizer operation is illustrated. The sequence is as follows:

STEP 1—INITIALIZATION

From an external start signal on line 570, an Equalization Complete (EC Flag) signal on line 572 is reset and memory locations, accumulator 556 and related registers are cleared. If an External Write signal is present on line 574, the control logic 504 allows the initial $K_k$'s and $S_k$'s to be loaded externally via shift register 576. When no External Write signal is present, internally stored values of $K_k$'s and $S_k$'s are supplied via control logic 504.

STEP 2—COMPUTE Po(n)

The values A(n), R(n) are obtained externally at the sampling time nT. R(n) and A(n) are pushed into their respective memories 520 and 548, respectively. $A(n-2)$ and K2 are fetched into memory 1 register 534 and memory 2 register 552, respectively. Their product is computed by the ALU 500 and held in the accumulator 556. Similarly, $A(n-1)$. $K_1$ is then computed and added to the contents of the accumulator 556. Similarly, A(n) is then added to the contents of the accumulator. The product terms associated the feedback Po terms are subtracted from the accumulator according to the equation:

$$\text{new } Po(n) = A(n) + K_1 A(n-1) + K_2 A(n-2) - K_3 Po(n) - K_4 Po(n-1) \quad \text{(Eq. 35)}$$

This operation corresponds to the $N(z^{-1})/D(z^{-1})$ function shown in FIG. 5. The result Po(n) is pushed into the Po memory 522.

STEP 3—COMPUTE $P_3(n)$

The $P_3(n)$ term corresponding to the output of the $-Ko\ z^{-1}/D(z^{-1})$ filter illustrated in FIG. 5 is computed in a similar manner according to:

$$\text{new } P_3(n) = -KoPo(n-1) - P_3(n) K_3 - P_3(n-1) K_4 \quad \text{(Eq. 36)}$$

the result is pushed on the $P_3$ memory stack 526.

STEP 4—COMPUTE $P_1(n)$

Similarly, $P_1(n)$ is computed and pushed on the $P_1$ memory stack according to:

$$\text{new } P_1(n) = KoA(n-1) - P_1(n) \cdot K_3 - P_1(n-1) \cdot K_4 \quad \text{(Eq. 37)}$$

which corresponds to the filter function of Ko $z^{-1}/D$ $(z^{-1})$ illustrated in FIG. 5.

STEP 5—COMPUTE E(n)

The error term is computed according to:

$$E(n) = P_o(n)K_o + R(n-1) \quad \text{(Eq. 38)}$$

E(n) is saved, i.e. it is stored in its prescribed location. This operation corresponds to the summing node function illustrated in FIG. 5.

STEPS 6 AND 7—COMPUTE $C_k$'s, UPDATING $K_k$'s

The $C_k$'s are computed based on the simplified approach described previously. The operation involves incrementing or decrementing $K_k$ based on the sign of the gradient vector term $C_k$, i.e., $$C_k(n) = P_k(n)E(n) \quad \begin{array}{l}\text{increment } K_k \text{ if sign negative}\\ \text{decrement } K_k \text{ if sign positive}\end{array} \quad \text{(Eq. 39)}$$

STEPS 8, 9 AND 10—TESTING FOR EQUALIZATION COMPLETE

The absolute value of $C_k$ is computed by changing the sign of $C_k$ if it is negative. The corresponding value of $\delta_k$ is subtracted from the absolute value of $C_k$. If the result in the accumulator is positive, the Test Flag is set = 1. If it is negative, the Test Flag Flip-Flop remains unchanged, i.e., $$|C_k| - \delta_k = + \text{ SET TEST FLAG } (TF)$$
$$= - \text{ NO CHANGE TO } TF$$

This step is performed for each gradient vector term $C_k$, i.e., $C_o$ throught $C_4$. At the end of this procedure, the Test Flag is examined. If the Test Flag is=0, indicating that no $C_k$ term exceeded the corresponding value of $\delta_k$, then equalization is complete. However, if the Test Flag = 1, indicating that one or more values of $|C_k|$ exceeded its corresponding value of $\delta_k$, then equalization is not complete and the cycle must be repeated. The control logic 504 will return to Step 2 to await the next sampling signal at the interval of T units. When Test Flag = 0, the Equalization Complete (EC) Signal is outputted for external recognition, and the procedure terminates allowing the external system to read the values of $K_o$ through $K_4$ from the memory for external use. The Equalizer may also be reassigned at this point to some other line.

From the viewpoint of execution times, the Equalizer must complete Step 2 through Step 9 in a time less than or equal to the sampling time T. For a sampling time T corresponding to present state-of-the-art sampling of speech telephony signals, 125 microseconds is adequate, corresponding to a sampling frequency of 4 Kh$_z$.

Based on a maximum of 50 control word executions corresponding to Step 2 through Step 9, each control word must be executed in approximately two microseconds. Thus, for a worst case control word consisting of fetching two words from memory 508 and memory 510, multiplying them together and adding them to the ACC, the performance requirements can be assigned as follows:

| | |
|---|---|
| Memory Access | .5 microseconds |
| Multiply | 1.0 microseconds |
| Add | .5 microseconds |
| Total | 2.0 microseconds |

The significance of these requirements are parallel register-to-register transfers and arithmetic operations. For 13-bit arithmetic, which satisfies the telephony requirements, these performance requirements are attainable in today's LSI technology, using the Equalizer structure described herein.

Present state-of-the-art off-the-shelf general purpose microcomputers of the 8- to 16-bit variety would not be able to meet the above performance requirements using standard programming techniques. The novel features heretofor described of the herein disclosed equalizer structure enable it to attain these performance requirements.

A brief recapitulation of said novel equalizer features includes, inter alia:

(1) Multiple memories which can be addressed simultaneously; (2) Special memory organization facilitating the operations required (push-down stacks which are directly addressable); (3) Parallel multiply/add arithmetic capability; (4) Microcoded control words which simultaneously control the memories and the arithmetic logic unit; (5) Control words directly related to the specific operation required, e.g., MULTIPLY/ADD, COMPLEMENT ACC IF NEG, INCREMENT, DECREMENT.

An alternative embodiment of the equalizer hereinbefore described is implementable utilizing a general purpose type signal processor having special arithmetic and memory processing capabilities. A simplified block diagram of such general purpose processor is illustrated by FIG. 7.

The circuits described are all implementable in digital LSI. By the addition of the feedback and feedforward loops and the F and H filters and by replacing the standard decoder output amplifier with the transconductance amplifier, a complete line circuit is possible on a single LSI chip. The F and H filters are simple recursive filters, which make it possible to include the F and H filters on a codec and/or codec and filter chip. Thus, the present invention eliminates the prior art analog 2/4 wire hybrid and discrete terminating and balancing networks replacing them with the programmable digital LSI circuits described. This results in lower costs of manufacture, installation and maintenance, in addition to improved performance.

Although non-recursive filters can be employed for the H and F filters, their costs would exceed those of the recursive filters described. Similarly, a non-recursive equalizer, based on known state-of-the-art techniques, could have been employed for either non-recursive or recursive F and H filters, but would be inferior as aforedescribed. Conversion of the non-recursive filter structures provided by a non-recursive equalizer could be utilized to convert to a recursive structure of the type described utilizing the Fletcher-Powell algorithm as described in Deczky, Synthesis of Recursive Digital Filters, IEE Trans. Audio Electro Acoust. Vol. AU-20, pp. 257-263, October 1972. Again, such technique requires substantially greater hardware then the all-recursive structure of the present invention.

Memory 330 of FIG. 7 includes allocated portions at 336 for storing $C_k$ coefficients, at 338 for storing $K_k$ coefficients, at 340 for storing correlator sums, at 342 for storing values of $D_k$ and $\delta_k$, at 344 for storing intermediate results $A(n)$, $P_k(n)$, ... $P_{k(nk/2)}$, and at 346 for storing a control program for accessing the stored data in accordance with addresses provided by control logic 332. Computation is accomplished via arithmetic unit 334.

FIG. 8 illustrates a generalized digital two-to-four wire converter for full duplex signals on line 400. The coder has a unity gain and includes analog-to-digital prefilter 402, analog-to-digital converter 404 and analog-to-digital postfilter 406. Operationally, the circuit of FIG. 8 functions in like manner to that of FIG. 3B in that line impedance matching occurs similarly. The decoder loop, including digital-to-analog converter 406 and associated prefilter 408 and postfilter 410 converts digital transmit signals on line 412 to analog signals on line 400. Transconductance amplifier 414 provides an infinite output admittance. Automatic equalizer system 130 provides updated filter coefficients and control to H filter 416 and F filter 418, with unwanted signal return in the receive signal eliminated at summing node 420. Coder feedback and the transmit signal are combined at summing node 421. Both coder feedback and F filter 418 inclusion in the circuit are determined by switches 422 and 424, respectively, under equalizer 130 control.

Figure 13:
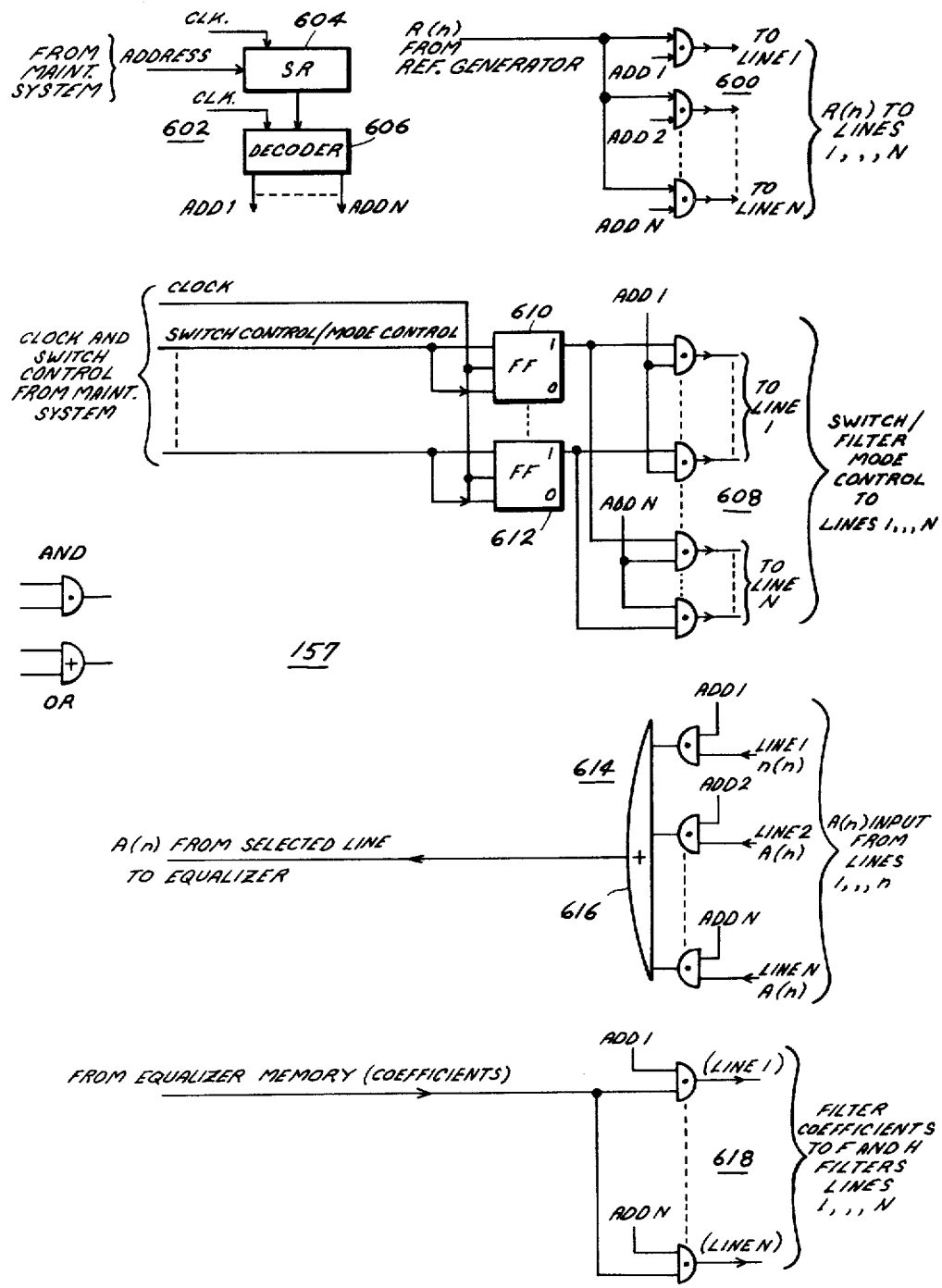
FIG. 13 illustrates the muliplexer/distributor of the present invention.

The multiplexer/distributor (MULDIS) 157 described generally with reference to FIG. 2 is illustrated in greater detail by FIG. 13, the MULDIS 157 enables the equalizer to be shared by a plurality of lines 1 thru N. In essence, the MULDIS 157 makes a determination of which line is to be connected to the equalizer. The MULDIS 157 multiplexes the $A(n)$ signals from the plurality of line circuits and distributes the filter coefficients, the switch and filter mode control signals, and the reference generator 161 output to the line circuit selected under control of a maintenance system.

Signals from the digital reference generator 161, $R(n)$ are coupled to lines 1 to N via logic gating 600, which ANDs $R(n)$ with ADD 1 ... ADD N from the maintenance system at logic 602. The appropriate address is shifted thru shift register 604, decoded by decoder 606 and coupled to logic 600 as illustrated.

The clock and switch control/mode control signals from the maintenance system are coupled to lines 1 thru N thru logic gating 608. These signals are coupled to flip-flops 610 and 612, the outputs of which flip-flops are AND'ed with the appropriate ADD 1 thru ADD N signal from decoder 606.

The $A(n)$ words from lines 1 thru N are selected at logic gating 614 and coupled to the equalizer as the output of OR gate 616. Each $A(n)$ input from each of lines 1 thru N is AND'ed with signals ADD 1 thru ADD N from decoder 606 at the AND gates in logic 614.

The filter coefficients to the F and H filters for each of lines 1 thru N, such as F filter 272 and H filter 116 of line circuit 1 of N are coupled from the equalizer to the appropriate line 1 of N via logic gating 618. The filter coefficients are AND'ed at logic 618 with the ADD 1 thru ADD N signals from decoder 606 to select the correct line.

Figure 14:
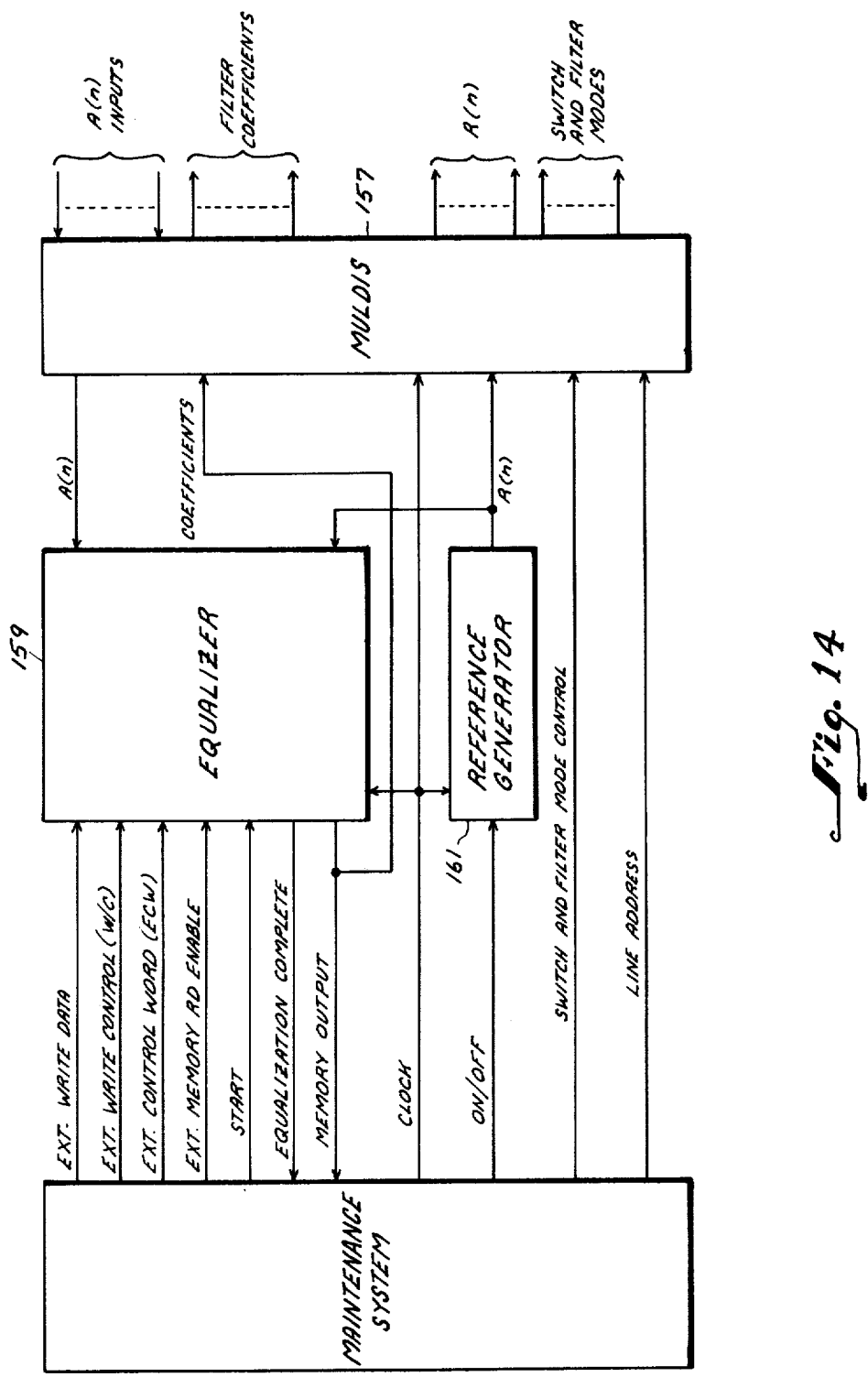
FIG. 14 illustrates the interface connections between the equalizer of FIG. 9 and the multiplexer/distributor of the present invention.

Referring now to FIG. 14, a block diagram of the major interface connections between the equalizer, the maintenance system, the MULDIS and the line circuits. The maintenance system 650 may comprise a conventional data source, such as a computer and its associated memory. The illustrated data and control signals, described hereinelsewhere, provided the requisite timing and handshake between the equalizer, the maintenance system and the line circuits via the MULDIS 157.

While the present invention has been described in connection with a preferred embodiment thereof, it is to be understood that additional embodiments, modifications and applications which will become obvious to those skilled in the art are included within the spirit and scope of the invention as set forth by the claims appended hereto.

I claim:

1. A digital telephone line circuit providing an interface between a full duplex analog telephone subscriber line and a digital switching system, comprising:
   means for automatically digitally synthesizing an output matching transmission line terminating impedance;
   two-to-four wire conversion means for digitally separating full duplex transmit and receive information signals on said subscriber line into a pair of digital signals, each separate from the other;
   automatic recursive equalizer means coupled to said two-to-four wire conversion means for providing time multiplexed signal optimization/equalization of said information signals by
   time multiplexing said recursive equalizer means to said full duplex line such that automatic equalization is provided for said line in accordance with its individual transmission line characteristics during the interval that said equalizer means is coupled to said two-to-four wire conversion means and to said means for digitally synthesizing an output matching transmission line terminating impedance.

2. A digital telephone line circuit in accordance with claim 1 wherein said synthesizing means comprises:
   analog-to-digital conversion means for converting said full duplex transmit and receive information signals from said subscriber line to digital signals;
   means for summing said digital signals with additional digital communication signals providing a composite digital signal in a negative feedback loop;
   digital filter means having said composite digital signal coupled thereto for directly establishing a predetermined output impedance characteristic, said digital filter having alterable filter coefficients, and having a digital signal output;
   digital-to-analog conversion means for converting said digital signal output to a analog voltage signal; and
   means for converting said analog voltage signal to an analog current such that the predetermined output impedance characteristic is high compared to the matched line.

3. A digital telephone line circuit in accordance with claim 2 wherein said means for converting said analog voltage signal to an analog current comprises:
   transconductance amplifier means having an output impedance defined by a specific current to voltage transfer ratio g mhos.

4. A digital telephone line circuit in accordance with claim 2 wherein said predetermined output impedance characteristic of said digital filter is derived by varying alterable digital filter coefficients in accordance with a control data input.

5. A digital telephone line circuit in accordance with claim 4 wherein:
said automatic equalizer includes means for deriving said control data input to adaptively vary the digital filter coefficients in a rapidly converging process to said established predetermined output impedance characteristic at final convergence.

6. A digital telephone line circuit in accordance with claim 4 wherein said digital filter is a recursive digital filter.

7. A digital telephone line circuit in accordance with claim 6 wherein said recursive digital filter includes five programmable filter coefficients.

8. A digital telephone line circuit in accordance with claim 3 wherein said subscriber line includes incidental shunting impedances between said line and said line circuit, and wherein the admittance of said line is represented by $Y_L$, the admittance of said shunting impedances is represented by Yx and wherein said predetermined output impedance characteristic of said digital filter is controlled to equal $Y_L - Yx$.

9. A circuit in accordance with claim 8 wherein said incidental shunting impedances include telephone battery feed and leakage impedance effects.

10. A digital telephone line circuit in accordance with claim 1 wherein said two-to-four wire conversion means comprises:
coder means for converting analog transmit and receive signals to a composite digital data stream;
means for deriving coefficient control data representative of the transmission characteristics of said two-wire path;
first digital filter means having said transmit signal coupled thereto, and including a coefficient matrix, said transmit signal being multiplied by said coefficient matrix to adjust the digital output of said first digital filter to derive a signal representative of an undesired signal portion from said transmit signal, said coefficient matrix being derived from said coefficient control data, such that a substantially infinite signal return loss is provided between the separated transmit and receive digital signals;
second digital filter means having said transmit digital signal coupled thereto, and including a variable coefficient matrix controlled by said coefficient control data for providing a synthesized impedance match to said subscriber line;
decoder means for converting said transmit signal to an analog receive signal, including transconductance amplifier means having a substantially infinite output impedance; and
means for combining said output from said first digital filter with said composite digital data stream to cancel the unwanted return transmit signal from said digital data stream, and having an output consisting of said receive signal.

11. A digital telephone line circuit in accordance with claim 10 wherein said multiplexing means for time sharing said automatic equalizer means over a plurality of subscriber lines includes means for storing coefficient control data representative of the individual transmission characteristics of each of said plurality of subscriber lines and further includes means for distributing said coefficient control data to the respective digital filters associated with each of said subscriber lines such that impedance matching and signal separation is maintained for each of said subscriber lines in accordance with its respective coefficient control data.

12. A digital telephone line circuit in accordance with claim 10 wherein said coder means is a sigma-delta coder.

13. A digital telephone line circuit in accordance with claim 12 wherein said coder means further includes:
prefilter means for limiting the input bandwidth to said coder; and
postfilter means for establishing a desired feedback gain characteristic.

14. A digital telephone line circuit in accordance with claim 13, further comprising:
switching means for providing a feedback path for said composite digital data stream to said digital transmit signal, such that said digital transmit signal and said composite digital data stream are combined prior to being coupled to said first digital filter means.

15. A digital telephone line circuit in accordance with claim 10 wherein said first and second digital filter means are comprised of recursive digital filters.

16. A digital telephone line circuit in accordance with claim 15 wherein said first and second recursive digital filters each include five alterable coefficient values.

17. A digital telephone line circuit in accordance with claim 10 wherein said decoder means further comprises:
prefilter means for establishing a desired decoder path gain characteristic; and
postfilter means for filtering said decoder output to reduce quantizing noise.

18. A digital telephone line circuit in accordance with claim 1 wherein said automatic equalizer is configured on a single large scale integrated circuit chip time multiplexed to N line circuits and wherein each of said N line circuits are configured on an individual LSI chip, such that N LSI line circuit chips are provided for N subscriber lines.

19. A digital telephone line circuit in accordance with claim 1 wherein said automatic equalizer means comprises:
means for digitally processing the input signal and said established reference to derive a digital gradient vector set of signals $C_l$ through $C_k$; and
means responsive to said gradient vector set of digital signals for adaptively changing digital recursive filter coefficients in a rapidly converging process to directly implement a digital recursive filter function at final convergence which processes the input signal to provide an equalized/optimized output signal with respect to the established reference and input signal.

* * * * *